United States Patent
Ohta et al.

(10) Patent No.: US 6,942,156 B2
(45) Date of Patent: Sep. 13, 2005

(54) NONCONTACT IC CARD (75) Inventors: Eiji Ohta, Miyagi (JP); Norihiko Yamazaki, Miyagi (JP); Shinichi Matsumura, Miyagi (JP)

(73) Assignee: Sony Corporation, Tokyo (JP)

( * ) Notice: Subject to any disclaimer, the term of this patent is extended or adjusted under 35 U.S.C. 154(b) by 39 days.

(21) Appl. No.: 10/182,085

(22) PCT Filed: Nov. 22, 2001

(86) PCT No.: PCT/JP01/10246
§ 371 (c)(1),
(2), (4) Date: Jul. 25, 2002

(87) PCT Pub. No.: WO02/43967
PCT Pub. Date: Jun. 6, 2002

(65) Prior Publication Data
US 2003/0062420 A1 Apr. 3, 2003

(30) Foreign Application Priority Data
Nov. 30, 2000 (JP) .......................... 2000-365967

(51) Int. Cl.[7] .............................................. G06K 19/06
(52) U.S. Cl. ...................... 235/492; 235/375; 235/380; 235/487
(58) Field of Search ................................ 235/492, 375, 235/380, 487, 379, 486, 386; 361/737; 343/872, 873

(56) References Cited

U.S. PATENT DOCUMENTS

| | | | | |
|---|---|---|---|---|
| 5,821,614 A | * | 10/1998 | Hashimoto et al. | 257/679 |
| 6,008,993 A | * | 12/1999 | Kreft | 361/737 |
| 6,012,641 A | * | 1/2000 | Watada | 235/488 |
| 6,076,737 A | * | 6/2000 | Gogami et al. | 235/492 |
| 6,095,423 A | * | 8/2000 | Houdeau et al. | 235/487 |
| 6,186,398 B1 | * | 2/2001 | Kato et al. | 235/449 |
| 6,422,468 B1 | * | 7/2002 | Nishizawa et al. | 235/486 |
| 6,580,481 B2 | * | 6/2003 | Ueda et al. | 349/115 |
| 6,607,135 B1 | * | 8/2003 | Hirai et al. | 235/487 |

FOREIGN PATENT DOCUMENTS

| | | |
|---|---|---|
| JP | 2000-048151 | 2/2000 |
| JP | 2000-311225 | 11/2000 |

* cited by examiner

*Primary Examiner*—Ahshik Kim
(74) *Attorney, Agent, or Firm*—Sonnenschein, Nath & Rosenthal LLP (57) ABSTRACT

In an IC card, an IC module constructed by mounting an IC chip and an antenna circuit on a substrate is sandwiched between at least a pair of exterior films. The IC chip is sealed with resin on its outside and reinforced by a reinforcement material having a substantially circular shape with a diameter greater than a longest dimension value of the IC chip. The height variation amount of the shape of the reinforcement material on a surface thereof is within a range of 20 μm or less. The reliability of the IC chip is ensured while the outer appearance of the card and print characteristic are not degraded.

25 Claims, 6 Drawing Sheets

NONCONTACT IC CARD

BACKGROUND OF THE INVENTION

The present invention relates to a non-contact IC card having recorded information based on electronic data and visible information thereof

BACKGROUND ART

A method of performing magnetic or optical reading has been conventionally and widely used for credit cards and the like, as ID (identification) cards for identifying individual persons. However, as altered data and forged cards have appeared due to popularized techniques, the number of people who actually suffered from forged cards increases, resulting in a social problem concerning secret of private information. Therefore, in recent years, IC cards incorporating IC chips have attracted attention, as a manager of personal data from the viewpoint of the size of information capacitance and ability to contain cipher data.

This kind of IC card has a connection terminal for electrical and mechanical connection to exchange information between an IC circuit and an external data processing device. Therefore, it involves various problems, e.g., maintenance of air-tightness of the inside of the IC circuit, countermeasures against electrostatic breakdown, defective electric connection of terminal electrodes, complicated mechanism of a reading/writing device. In addition, a manual operation of inserting or attaching an IC card into a reading/writing device is finally required, and leads to low efficiency and complicated operation in some use fields. There hence have been demands for a non-contact IC card capable of exchanging information with a remote data processing device so that portable use can be realized without troubles.

Hence, developments have been made in a non-contact IC card which comprises an antenna for utilizing electromagnetic waves and an IC chip having a memory and a calculation function, in the base body of the card made of plastics. This is designed to drive the IC by a dielectric motive force excited from the antenna inside the card by an external electromagnetic wave from a reader/writer. This card need not include a battery power source insides, so a card with excellent activity can be provided. In some applications, a thin battery such as a paper battery is included internally to send a wave for a long distance or to use a high frequency band. However, from the viewpoints of costs and applications, a battery-less type has been eagerly demanded.

In information recording in these cards, digital recording is carried out by providing a recordable IC chip at a part of the card. In case where contents of recorded information are displayed or confirmed in these cards, read processing for recorded information must be executed by a dedicated reading device, and general users do not have a way for confirming them. For example, in some member cards, premiums and points are provided for the members. However, in case of only recording on a card, an introduction must be made optionally by a guidance letter or the like. Hence, the demand for simplified display of contents of recorded information has been being increased. In recent years, to comply with this demand, development has been made in a reversible display technique of high/low-molecular type in which organic low molecules in a resin binder, to achieve display based on nebular-transparent contrast. The high/low-molecular type reversible display medium is constructed by a support member such as a plastic sheet or the like/a coloring layer/a recording (high/low-molecular) layer/a protect layer or the like.

Thus, necessity has become more and more serious for IC cards which has a visible recognition display function and also manages secret based on electronic information.

Further, in recent years, a bare-chip mounting method in which a junction electrode part between an antenna and an IC chip is provided on a sheet and the IC chip is directly mounted has been attempted to reduce costs. This case adopts a face-down system in which a projection called a bump is provided on an electrode part formed on a circuit-forming surface of the IC chip by solder, gold, or the like. Some connections may be resins containing conductive grains, such as anisotropic conductive films or resins, or may have an object of filling a gap between the IC chip circuit surface and a module substrate, such as an under-fill. In this case, also, enclosure using resins as described must be made to attain operational reliability for inletting. In a card using an IC chip, all data may be lost if the IC chip is mechanically broken. Therefore, it is a problem how to improve mechanical strength against spot pressure such as bending, spot impacts, and the like.

However, enclosure of an IC chip cannot yet achieve sufficient strength at present although resin having rigidity different from the base material of the card partially functions as a protector for the IC chip. Therefore, the mechanical strength is not sufficient, and there is a problem in management of money information and ID information which requires high functions from cards.

Hence, a method of providing a reinforcement material together with a sealing material has been proposed to respond to prevent breakdown of the junction part of the IC chip or the IC chip itself.

However, if this reinforcement material is used together with a sealing material having a hardening/contraction effect, the reinforcement material deforms in accordance with contraction of the sealing material. After providing and card-forming an IC-mounting module having the deformed reinforcement material, a plurality of thermoplastic resin sheets, and a reversible heat-sensitive recording layer on the exterior side, the deformation of the part of the reinforcement material cannot be absorbed when forming the card from the deformed material but convexes and concaves remain on the surface of the card, thus affecting the flatness. If convexes and concaves thus remain, spacing occurs so that sufficient heating cannot be attained during printing operation on the reversible heat-sensitive recording sheet by a thermal head or the like. Consequently, a problem is involved in that recording errors easily take place.

In addition, polyvinyl chloride (PVC) resin, co-polymer of vinyl chloride and vinyl acetate are mainly used as materials of these cards. Particularly, polyvinyl chloride resin is generally used. Polyvinyl chloride resin is excellent in physical characteristics, mechanical characteristics, and emboss property at text part, and is thus just optimal material for cards, which is widely used at present.

However, although polyvinyl chloride resin has excellent material property, process-ability, and economic property, it generates a hydrogen chloride gas and damages a furnace when it is disposed of, and particularly, when it is burnt. Thus, there are problems that the lifetime of the furnace is shortened and polyvinyl chloride resin is suspected of relation with dioxin, which is dealt with as one of environmental hormones. With respect to these problems, many countries including Germany and those North Europe have come into movement of depositing PVC. Domestically, there has been a similar trend of using other resins than polyvinyl chloride, in the fields of building materials, industrial resources, and wrapping materials.

SUMMARY OF THE INVENTION

The present invention has been proposed in view of the conventional situation as described above and has an object of providing an IC card which ensures reliability of the IC chip without spoiling the outer appearance or the print characteristic.

In a non-contact IC card according to the present invention, an IC module constructed by mounting an IC chip and an antenna circuit on a substrate is sandwiched between at least one pair exterior films, wherein the IC chip is sealed with resin on outside of the IC chip and reinforced by a reinforcement material having a substantially circular shape with a diameter greater than a longest dimension value of the IC chip, and a height variation amount of the shape of the reinforcement material on a surface thereof is within a range of 20 µm or less.

In the non-contact IC card according to the present invention as described above, the height variation amount of the surface shape of the reinforcement material is defined to be within a range of 20 µm or less. Therefore, concaves and convexes disappear from the card surface, and the card has an excellent appearance and excellent print characteristic.

Other objects, features, and advantages will be clearly understood from the embodiments of the present invention described later and the appended drawings.

DETAILED DESCRIPTION OF THE PRESENTLY PREFERRED EMBODIMENTS

Hereinafter, with reference to the drawings, detailed explanation will be made of embodiments of an IC card to which the present invention is applied.

Figure 1:
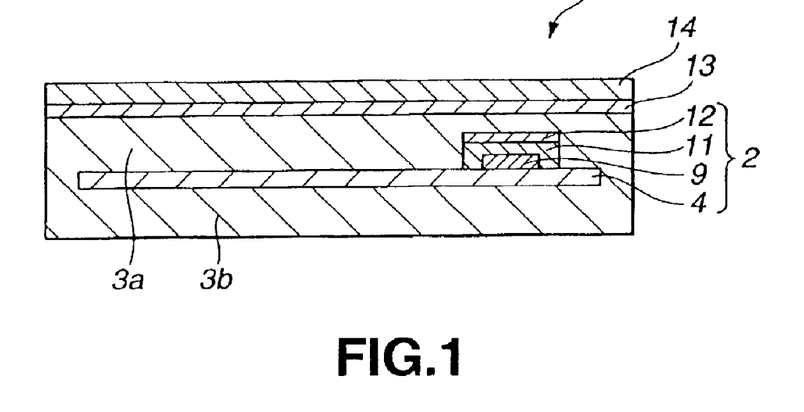
FIG. 1 is a cross-sectional view showing a structural example of an IC card according to the present invention.

FIG. 1 shows a structural example of an IC card 1 according to the present invention. This IC card 1 is constructed by sandwiching an IC module 2 between a pair of thermoplastic resin sheets 3a and 3b.

Figure 2:
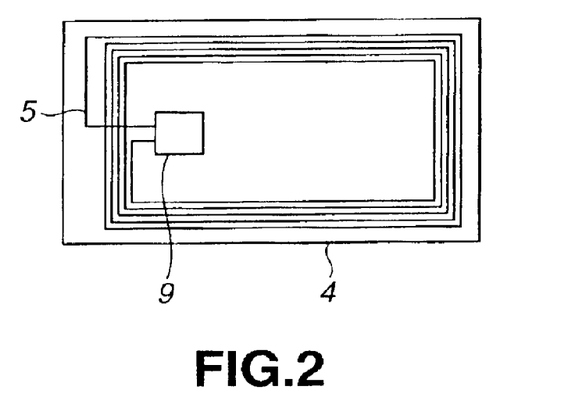
FIG. 2 is a plan view showing a structural example of an IC module used in the IC card shown in FIG. 1.
Figure 3:
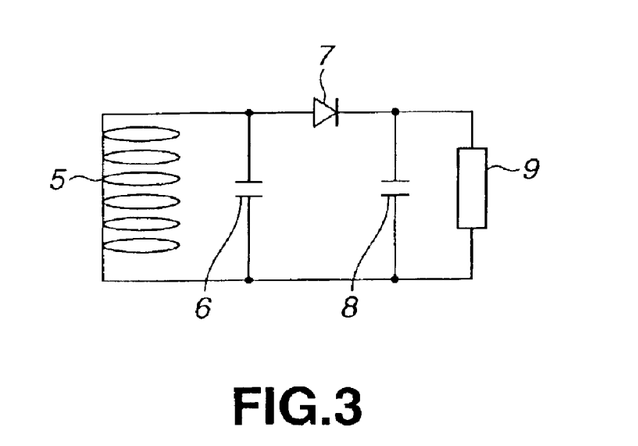
FIG. 3 is a circuit diagram showing a structural example of an IC module used in the IC card shown in FIG. 1.

FIG. 2 shows a plan view of the IC module 2, and FIG. 3 shows a circuit diagram thereof. As shown in these figures, the IC module 2 is constructed in a structure in which a resonance circuit comprised of an antenna coil 5 and a tuning capacitor 6 is connected to a rectification diode 7, a smoothing capacitor 8, and an IC chip 9, on an insulating substrate 4. Note that the tuning capacitor 6, rectification diode 7, and smoothing capacitor 8 are incorporated in the IC chip 9 in some cases.

The material of the insulating substrate 4 is a single material or mixture selected from a polyester group including polyimide, polyester, polyethylene terephthalate, polyethylene naphthalate, and the like, a polyolefin group including propylene and the like, a cellulose group including cellulose triacetate, cellulose diacetate, and the like, a vinyl-based resin group including acrylonitrile-butadiene-styrene resin, acrylonitrile-styrene resin, polystyrene, polyacrylonitrile, polyacrylic methyl, polymethyl-methacrylate, polyacrylic ethyl, polyethyl-methacrylate, vinyl acetate, polyvinyl alcohol, and the like, and a polycarbonate group. Any material can be used without problems, as long as it is an insulating organic material.

A method of providing the above-mentioned antenna coil 5, tuning capacitor 6, rectification diode 7, smoothing capacitor 8, IC chip 9, and the like on the insulating substrate 4 will be a method of fixing by high/low-molecular organic materials or a composite material thereof.

Resin that can be used will be single or mixed thermoplastic resin selected from vinyl-based resin such as polyester-polyurethane resin, polyurethane resin, polyester resin, acrylonitrile-butadiene-styrene resin, acrylonitrile-styrene resin, polystyrene, polyacrylonitrile, methyl polyacrylate, polymethyl-methacrylate, ethyl polyacrylate, polyethyl-methacrylate, vinyl acetate, polyvinyl alcohol, or the like, thermoplastic resin such as polycarbonate or the like, and the like.

Further, thermosetting resin such as phenol resin, epoxy resin, silicon resin, or the like can be used as known binder resin. In addition, a chemical compound containing two or more molecules of isocyanate (NCO) in one molecule or a chemical compound including an epoxy-based functional group can be used as a reactive organic low-molecular agent. Any of these compounds including a reactive functional group can be used, mixed with a compound having a reactive property such as a compound including a hydroxyl group, amino group, or the like, without problems.

Figure 4:
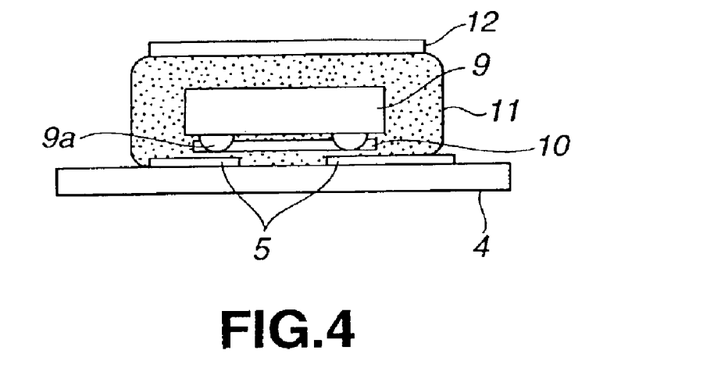
FIG. 4 is an enlarged cross-sectional view showing an IC chip mounting part of an IC module.

In addition, as shown in FIG. 4 which enlarges the part of the IC chip 9, a method of connection between the IC chip 9 and the conductive layer part will be a method in which the electrode (bump) 9a of the IC chip 9 and the antenna coil 5 or the conductive layer part of the IC-mounting part are connected in a face-down manner through an adhesive layer 10 and further an anisotropic conductive adhesive layer.

Used as the adhesive layer 10 will be single resin, a mixture, or a complex selected from vinyl-based resin such as polyurethane resin, polyester-polyurethane resin, acrylonitrile-butadiene-styrene resin, acrylonitrile-styrene resin, polystyrene, polyacrylonitrile, methyl polyacrylate, polymethyl-methacrylate, ethyl polyacrylate, polyethyl-methacrylate, vinyl acetate, polyvinyl alcohol, or the like, polycarbonate-based resin, and epoxy resin, and the like.

For the adhesive layer 10, it is possible to use a material obtained by mixing grains subjected to non-conductive processing based on an organic material into the surface of such grains that are obtained by making conductive processing (physical or chemical processing based on Au, Ni, Al, Sn, or the like) on the surface of conductive grains (Au, Ni, Al, Sn, or the like) or non-conductive grains, hollow grains, foil, or the like, in order to attain an anisotropic conductive adhesive layer. In these grains that have been subjected to non-conductive processing, the conductive layer is exposed since the non-conductive processing layer is broken when mounting the IC chip 9, and are used for junction between the IC chip 9 and the antenna coil 5 or the conductive layer. In a use method thereof, the IC chip 9 is brought into contact with the antenna coil 5 or the conductive layer while pressure is applied or heating is further maintained, so that the IC chip 9 can contact the antenna coil 5 or the conductive layer part when mounting the IC.

Further, the IC chip 9 adhered to the insulating substrate 4 is sealed by a sealing material 11 flowed so as to cover the periphery of the IC chip 9, as shown in FIG. 4, in order to guarantee the conductive characteristic, and is reinforced and protected by a reinforcement material 12 provided on the sealing material 11.

Epoxy-based, silicon-based, or phenol-based thermosetting resin can be used as the sealing material 11. In order to prevent stress from being applied to the IC chip 9 due to contraction of tile volume caused by a thermosetting reaction, a filler, hollow grains, or foil singly or a complex thereof is mixed into this resin and put to use. To restrict generation of stress due to the filler, hollow grains, or foil, these materials are used with their size, grading, and mixing ratio thereof adjusted properly.

Used as the reinforcement material 12 is a substantially circular disk having a larger diameter than the longest dimension value of the IC chip 9.

The IC chip 9 adhered to the insulating substrate 4 forms a convex part on the insulating substrate 4. There is a case that a convex part is also formed on the surface of the reinforcement material 12 so as to reflect the convex shape of this IC chip 9, so convexes and concaves appear when the reinforcement material 12 is viewed entirely. The convexes and concaves of this reinforcement material 12 appear also as convexes and concaves on the card surface. If there are convexes and concaves on the card surface, not only the appearance of the card is degraded but also print characteristics are degraded, e.g., blurring or print errors occur in printing on a visible recording layer.

Hence, in the IC card 1 according to the present invention, the surface variation amount (height difference between convexes and concaves) of this reinforcement material 12 is defined to be 20 µm or less. By defining the surface variation amount (height difference between convexes and concaves) of the reinforcement material 12 is defined to 20 µm or less, convexes and concaves appearing on the card surface are reduced to provide the card with good appearance. In addition, excellent print characteristics without blurs or print errors can be attained in printing onto the visible recording layer.

For example, to adjust the surface variation amount of the reinforcement material 12 to 20 µm or less, it is effective to use a material which has Vickers hardness within a range of 200 or more and 580 or less, as the material forming the reinforcement material 12. The Vickers hardness is obtained by a measurement method according to JIS-Z2244, and a Vickers hardness tester according to the standard of JIS-B7725 is used.

If the Vickers hardness is less than 200, the shape of the IC chip 9 is reflected on the surface of the reinforcement material 12, or deformation is caused in accordance with contraction/hardening of the sealing material 11. Therefore, the surface variation amount of the reinforcement material 12 cannot be reduced to 20 µm or less. In addition, the convexes and concaves also appear on the card surface, thereby degrading the appearance and causing blurs and print errors. Thus, print characteristics deteriorate. Meanwhile, if the Vickers hardness is 580 or more, the shape of the IC chip 9 is not reflected on the surface of the reinforcement material 12 or deformation is not caused in accordance with contraction/hardening of the sealing material 11. The surface variation amount of tile reinforcement material 12 can be restricted to be very small. However, the reinforcement material 12 is not soft, and therefore, the bending strength is so low that the card cannot be provided with softness.

Accordingly, by using a material having Vickers hardness within the range of 200 or more and less than 580 as the material for the reinforcement material 12, the shape of the IC chip 9 can be prevented from being reflected on the surface of the reinforcement material 12, and the surface variation amount of the reinforcement material 12 can be adjusted to 20 µm or less. Meanwhile, tile card can be provided with proper softness.

The material which has Vickers hardness of 200 or more and less than 580 will be nonferrous metal material such as Cu—Sn—P, Ni—Cu—Zn, Cu—Be—Ni—Co—Fe, or the like, nickel/alloy-based material such as Ni—Co, Ni—Cr, Ni—Mo—Cu, or tile like, nickel/ferrous-alloy-based material such as Ni—Fe or the like, titanium/molybdenum/ stainless-based material such as SUS304, SUS301, SUS316, SUS631, ASL350, SUS430, SUS420, or tile like, or carbon steel such as SK steel, or the like. It is possible to use any of these materials after further increasing the hardness via a heat treatment.

Also, the thickness of the reinforcement material 12 should preferably be within a range of 50 µm or more and 100 µm or less, if the Vickers hardness of the material to be used is 200 or more. If tile thickness of the reinforcement material 12 is 50 µm or less, the convex shape of the IC chip 9 cannot be absorbed, and deformation is caused in accordance with contraction/hardening of the sealing material 11. Thus, the surface variation amount of the reinforcement material 12 cannot be reduced to 20 µm or less. Alternatively, if the thickness of the reinforcement material 12 exceeds 100 µm, it is difficult to set the thickness of the IC card 1 within the range according to ISO definitions. Accordingly, by setting the thickness of the reinforcement material 12 within a range of 50 to 100 µm, the convex shape of the IC chip 9 can be absorbed, and deformation in accordance with the contraction/hardening of the sealing material 11 is not caused. Thus, the surface variation amount of the reinforcement material 12 can be reduced to 20 µm or less, and the thickness of the IC card 1 can be easily set within the range according to ISO definitions.

If the Vickers hardness of the material used for the reinforcement material 12 is 300 or more, the thickness of the reinforcement material 12 should preferably be within a range of 30 μm or more and 100 μm or less. If the thickness of the reinforcement material 12 is 30 μm or less, the convex shape of the IC chip 9 cannot be absorbed, and deformation is caused in accordance with contraction/hardening of the sealing material 11. Thus, the surface variation amount of the reinforcement material 12 cannot be reduced to 20 μm or less. In addition, if the thickness of the reinforcement material 12 exceeds 100 μm, it is difficult to set the thickness of the IC card 1 within a range according to ISO definitions. Therefore, by setting the thickness of the reinforcement material 12 within a range of 30 μm or more and 100 μm or less, the convex shape of the IC chip 9 is absorbed and deformation is not caused in accordance with contraction/hardening of the sealing material 11, if the Vickers hardness of the material used for the reinforcement material 12 is 300 or more. The surface variation amount of the reinforcement material 12 can be reduced to 20 μm or less, and the thickness of the IC card 1 is set within a range according to ISO definitions.

Further, sheets made of thermoplastic resin having a low-crystallization characteristic of a crystallization rate of 5% or less are used as thermoplastic resin sheets 3a and 3b which sandwich the IC module 2 as described above. As the thermoplastic resin having a low-crystallization characteristic of a crystallization rate of 5% or less, it is possible to use copolymer of terephtalic-acid-cyclohexanedimethanol-ethyleneglycol, or alloy of this copolymer and polycarbonate, copolymer of terephtalic-acid-isophtalic-acid-ethyleneglycol, or one kind or mixed plural kinds of non-crystal resin selected from a group of resin of copolymer of acrylnitrile-butadiene-styrene, polystyrene resin, polyacrylnitrile resin, polyvinyl-alcohol resin, methyl-polyacrylate resin, polymethyl-methacrylate resin, vinyl acetate resin, polycarbonate resin, and the like.

These kinds of resin do not generate a gas such as a hydrogen chloride gas which provides large influences on furnaces and environments, during incineration of disposition after use. Therefore, by using resin as described above, processing after disposition can be facilitated, and problem of environmental pollution is not caused in processing for disposition.

In addition, in place of non-crystal resin of these kinds, it is possible to use a double-side non-crystal sheet created from non-crystal resin and crystal resin by a co-extrusion method. Further, low-crystallization polyester resin of these kinds or other resin may be added with various additives or a substance such as polymer or the like within a range of weight ratio of 50% or less, or more preferably within 15% or less.

A reversible heat-sensitive recording sheet 14 is adhered to one of the surfaces of the thermoplastic resin sheets 3a and 3b by way of an adhesive layer 13. This reversible heat-sensitive recording sheet 14 is constructed by a high-molecule film, a coloring layer, a reversible heat-sensitive recording layer, and a transparent protect layer.

As the high-molecule film, it is possible to use various high-molecule films including, for example, a polyethylene-terephtalate (PET) film and the like.

The coloring layer is prepared, for example, by forming a metal film of aluminum or the like on the high-molecule film by a vacuum deposition method or the like.

The heat-sensitive recording layer can be selected and used from a high-molecule/low-molecule type in which nebular and transparent states change reversibly in accordance with the change of the crystal state of the organic low-molecule material dispersed in the mother material (matrix) of the resin, and a leuco compound type as a thermo-coloring compound which utilizes reversible coloring reaction between an electron donor type coloring compound and an electron acceptor type compound which are dispersed in the mother material of the resin. The heat-sensitive recording layer is formed to have a film thickness of about 4 to 20 μm by a coating method or the like.

At first, the organic low-molecule material to be dispersed in the heat-sensitive recording layer will be fatty acid or a derivative of fatty acid or alicyclic organic acid. For example, the material will be saturated or non-saturated mono- or di-carboxylic acid, myristic acid, penta-decane acid, palmitic acid, hepta-decane acid, stearic acid, nano-decane acid, arachic acid, behenic acid, lignoceric acid, cerotic acid, montan acid, melissic acid, or the like. Examples of the non-saturated fatty acid will be olein acid, elaidic acid, linoleic acid, sorbic acid, stearol acid, and the like. Note that the fatty acid, derivative of fatty acid, and alicyclic organic acid are not limited to those described above, and one or two or more kinds of them can be mixed and applied.

The mother material of the resin will be a single, mixture, or copolymer selected from acryl-based resin, urethane-based resin, polyester-based resin, cellulous-acetate-based resin, nitro-cellulous-based resin, vinyl-chloride-based resin, and vinyl-acetate-based resin. Meanwhile, to control the transparence temperature range of the reversible heat-sensitive recording part, a plasticizer of resin, a high-boiling-point solvent, and the like can be added to the mother material of resin, at 0.1 to 20 weight %. Further, to improve the resistance against repetitive printing/erasure of the reversible heat-sensitive recording part, a hardener, crosslinking agent, and the like which achieves three-dimensional bridging corresponding to the mother material of resin can be added to the mother material of resin, at 0.5 to 10 weight %.

Next, the heat-sensitive recording layer of the leuco compound type is a thermo-coloring compound utilizing reversible coloring reaction of a leuco compound and a coloring/decoloring agent which are dispersed in the mother material (matrix) of resin, and can be provided with a film thickness of 4 to 20 μm by a printing method, coating method, or the like. The leuco compound, which is used in the heat-sensitive recording layer and is normally colorless or light-colored, will be generally represented by those used for a pressure-sensitive recording paper, heat-sensitive recording paper, light-sensitive recording paper, conductive heat-sensitive recording paper, heat-sensitive transfer paper, and the like. Xanthene-based, spiro-pyran-based, lactone-based, fluorane-based, or salton-based compound which has a partial skeleton of lactone, salton, spyro-pyran, or the like is used. However, it is not limited particularly.

Specific examples thereof will be 3,3-bis(p-dimethylaminophenyl)-6-dimethylaminophthalido, 3,3- bis (p-dimethylaminophenyl)phthalido, 3,3-bis(1,2-dimethylindole-3-il)-6-dimethylaminophthalido, 3-dimethylamino-6- chloro-7- methylfulorine, 3,3-bis(9-ethylcarbazole-3-il-5)-dimthylaminophthalido, 3-dimethylamino-7-dibenzylaminofulorine, 3-diethylamino-7-chrolofulorine, 3-diethylamino-6-methyl-7-anilinofulorine, 3-piperidino-6-methyl-7-anilinofulorine, 3-(n-ethyl-n-nitril) amino-6-methyl-7- anylinofulorine, 3-dibuthylamino-6-methyl-7-anilinofulorine, 3-(n-ethyl-n-tetrahydrofil)amino-6-methyl-7-anilinofulorine, and the like. These are used singly or mixedly.

Meanwhile, the coloring/decoloring agent is a compound which releases reversibly proton by action of thermal energy and makes both of coloring effect and decoloring effect on the leuco compound. That is, this compound has both of an acidic group consisting of a phenol hydroxyl group or a carboxyl group and a basic group consisting of an amino group, and becomes acidic or basic to color or decolor the leuco compound. The basic group may exist as a functional group or as a part of a compound.

In addition, the coloring/decoloring agent having either an acidic or basic group will be, for example, aminobenzoic acid, 0-aminobenzoic acid, 4-amino-3-methylbenzoic acid, 3-amino-4-methylbenzoic acid, 2-amino-5-ethylbenzoic acid, 3-amino-4-buthylbenzoic acid, 4-amino-3-methoxybenzoic acid, 3-amino-4-ethoxybenzoic acid, 2-amino-5-chlorobenzoic acid, 4-amino-3-bromobenzoic acid, 2-amino-2-nitrobenzoic acid, 4-amino-3-nitrobenzoic acid, 3-amino-4-nitrilbenzoic acid, aminosalicylate, diaminobenzoic acid, 2-methyl-5-aminonaphthoic acid, 3-ethyl-4-aminonaphthoic acid, nicotinic acid, isonicotinic acid, 2-methylnicotinic acid, 6-chloronicotinic acid, or the like.

The compound which includes a basic group as a part of a chloric compound will be a salt or a complex salt of a compound including a phenolic hydroxyl group or a carboxyl group, and a compound including an amino group. An example thereof will be a salt or a complex salt of an acid selected from hydroxybenzoic acids, hydroxysalicylic acids, gallic acids, bisphenol acetates, and the like, and a base selected from aliphatic amines, phenylalkylamines, triallylalkylamines, and the like. Specific examples thereof will be a p-hydroxybenzoic acid-alkylamine salt, p-hydroxybenzoic acid-phenylalkylamine salt, m-hydroxybenzoic acid-alkylamine salt, p-hydroxybenzoic methyl-alkylamine salt, p-hydroxybenzoic stearyl-alkylamine salt, bisphenol acetate-alkylamine, bisphenol octyl acetate-alkylamine salt, and the like, which are used singly or mixedly. Note that the leuco compound and the coloring/decoloring agent are not limited to those described above, and one or two or more kinds of those compounds may be mixed and applied.

In addition, the mother material of resin to be used is a single, mixture, or copolymer of resin selected from acryl-based resin, polyester-based resin, polyurethane-based resin, polyurea, melamine, polycarbonate, polyamido, polyvinylpyrolidone, polyvinylalcohol, polyvinyl chloride, polyvinyl buthylal, and the like. Further, in order to improve the resistance against repetitive printing/erasure at the reversible heat-sensitive recording part, a hardener or bridging agent, which forms a three-dimensional bridge corresponding to the mother material of resin, can be added to the mother material of resin, 0.5 to 10 weight %. Further, to improve the resistance, it is possible to add an ultraviolet absorbent which has a relatively high compatibility with the leuco compound.

In the IC card 1 according to the present invention as described above, the surface variation amount (height difference between convexes and concaves) of the reinforcement material 12 of the IC module 2 is defined to be 20 $\mu$m or less, so that convexes and concaves appearing on the card surface can disappear. As a result of this, this IC card 1 has a good appearance and provides excellent print characteristics without blurs or print errors, in printing on the visible recording layer.

Further, as a method of manufacturing this IC card 1, it is possible to use a melt lamination method by heat press. In the melt lamination method, respective materials of the card are sandwiched between mirror plates which are one size larger than the materials, and they are integrated by heat melting press. The mirror plates used at this time are copper plates subjected to chrome plating, stainless plates whose surfaces are polished, aluminum plates whose surfaces are polished, or the like. In the melt lamination method, transparent protect sheets are layered on both surfaces of the printed thermoplastic resin sheets 3a and 3b. At this time, the types of the protect sheets may be different from each other. In the printing on the thermoplastic resin sheets 3a and 3b, texts or figures can be printed in the same method as conventional printing on papers and plastics, i.e., known printing methods such as a offset printing method, screen printing method, gravure printing method, and the like.

After the melt lamination, each material of the integrated card is peeled from the mirror plates, and punching is performed into the card shape with a single blade or a male-female mold.

Normally, after punching the card shape, relief letters are embossed by an embosser, and tipping is performed on the letters by thermally transferable foil to achieve coloring, or magnetic information is encoded on magnetic stripes. In cases, a portrait photograph or barcodes are transferred. Thus, the card is finished. For the purpose of improving the resistance against frictions and the like of the printed layer of the letters or figures, it is possible to further provide a protect layer 15. Further, after cutting and processing for a concave shape for providing the contact IC chip, an adhesive can be used to embed the IC chip with use of an adhesive, and thus, a combination card or a hybrid card which includes both the non-contact IC and the contact IC can be prepared.

The IC card 1 according to the present invention is not limited to the above embodiment but can be variously modified without deviating from the scope of the present invention.

Figure 5:
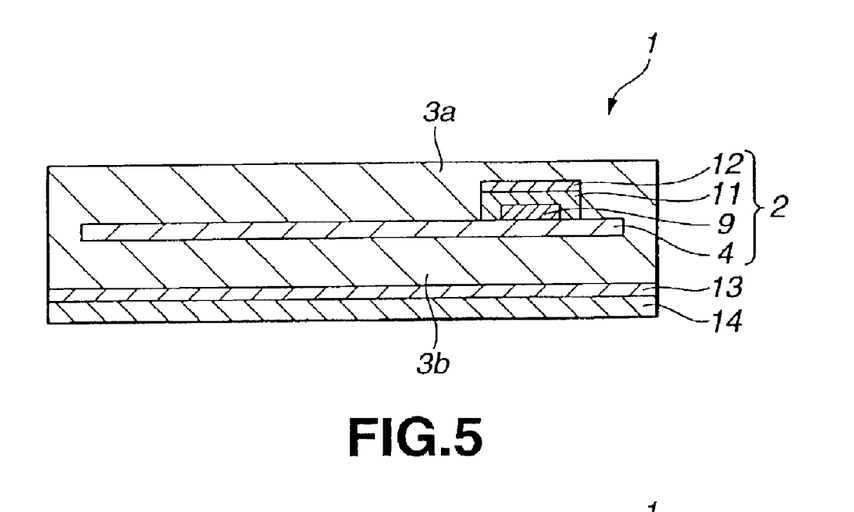
FIG. 5 is a cross-sectional view showing another structural example of an IC card according to the present invention.
Figure 6:
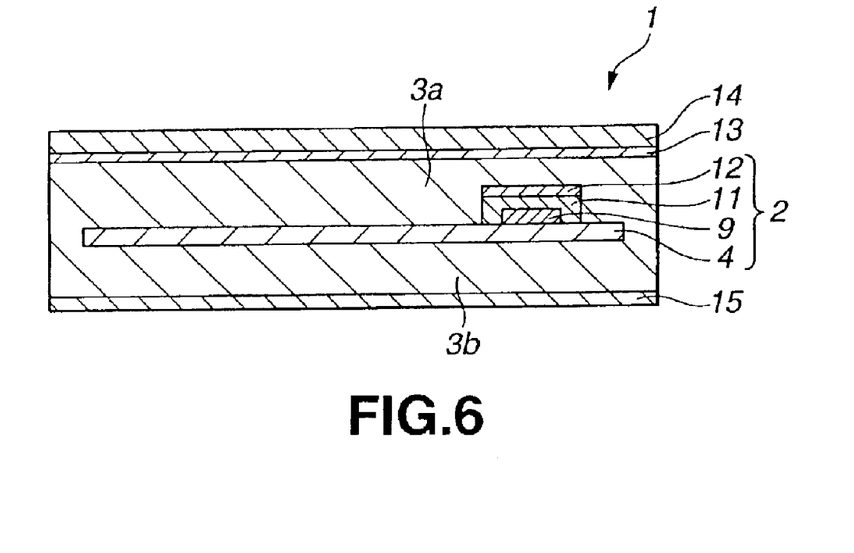
FIG. 6 is a cross-sectional view showing another structural example of an IC card according to the present invention.

For example, the embodiment described above has been explained with reference to a case where the reversible heat-sensitive recording sheet 14 is adhered to the thermoplastic resin sheet 3a in the side of the IC-chip-mounting surface. However, as shown in FIG. 5, the reversible heat-sensitive recording sheet 14 may be adhered to the thermoplastic resin sheet 3b in the side opposite to the side where the IC chip 9 is mounted. In addition, as shown in FIG. 6, it is effective to provide a protect layer 15 on the printed surface on the surface of the thermoplastic resin sheet 3b, on the thermoplastic resin sheet 3b in the side opposite to the thermoplastic resin sheet 3a to which the reversible heat-sensitive recording sheet 14 is adhered. By providing the protect layer 15, peeling of the reversible heat-sensitive recording sheet 14 is prevented and the adhesion can be maintained.

Figure 7:
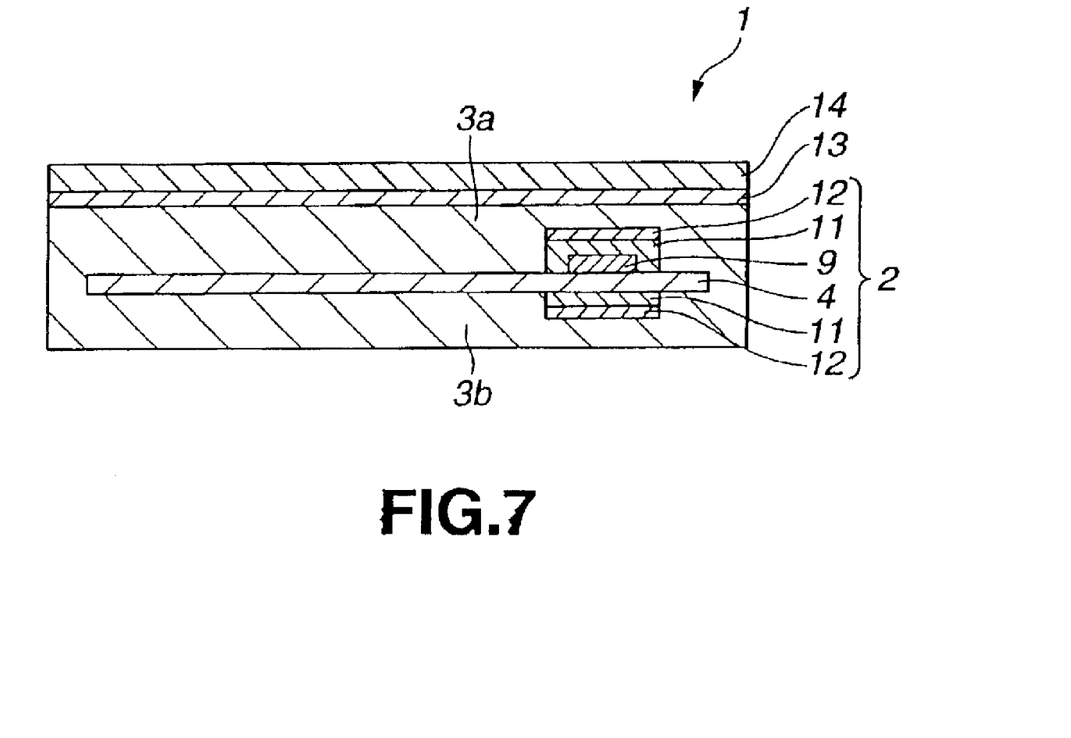
FIG. 7 is a cross-sectional view showing another structural example of an IC card according to the present invention.
Figure 8:
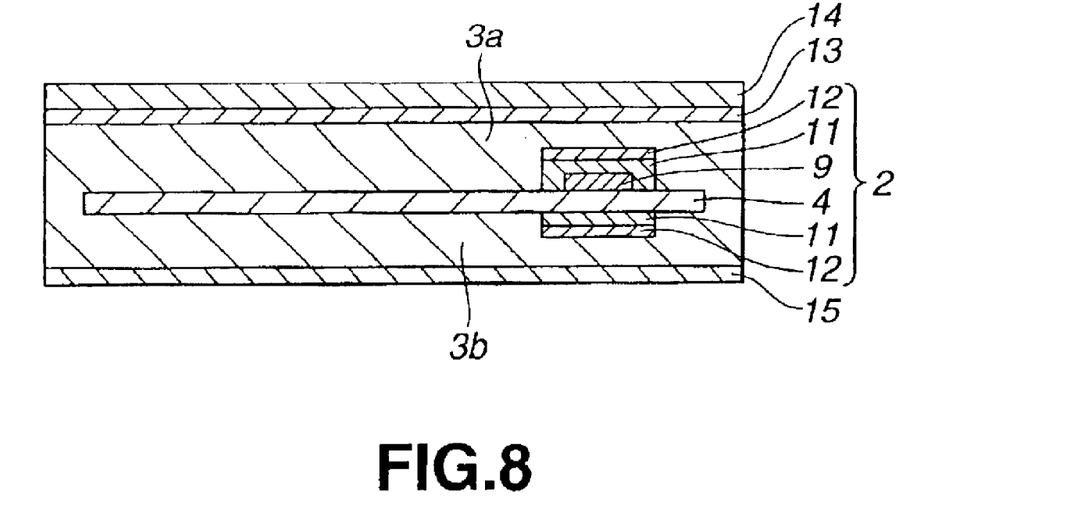
FIG. 8 is a cross-sectional view showing another structural example of an IC card according to the present invention.
Figure 9:
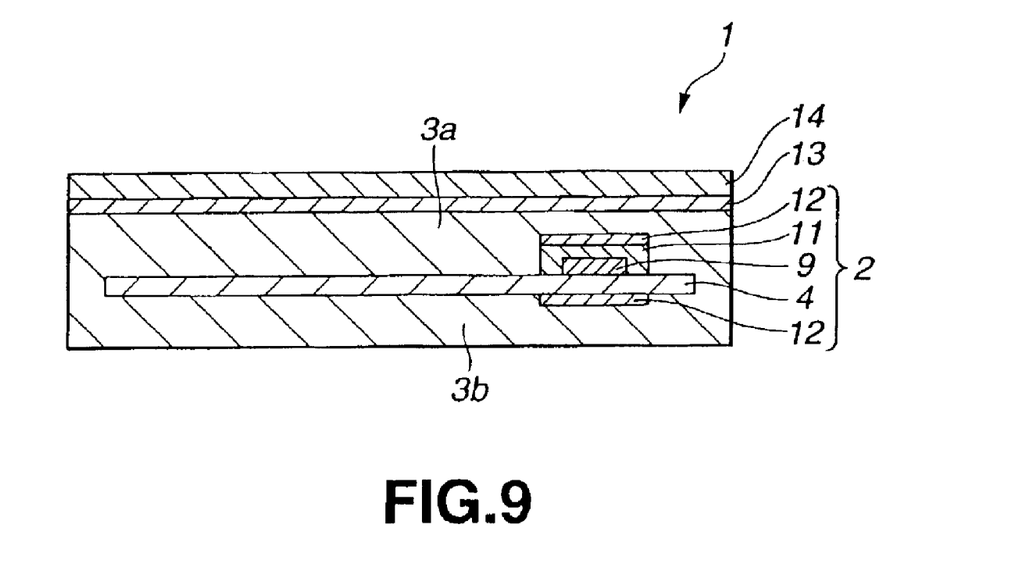
FIG. 9 is a cross-sectional view showing another structural example of an IC card according to the present invention.

Further, as shown in FIGS. 7 to 9, the reinforcement material 12 may be provided not only on the IC-chip-mounting surface of the IC module 2 but also in the side opposite to the IC-chip mounting surface. By providing the reinforcement material 12 not only on the IC-chip-mounting surface but also on the surface where the IC chip is not mounted, the static load strength can be increased more. In this case, as shown in FIGS. 7 and 8, the surface of the IC module 2 where the IC chip is not mounted may be sealed with resin, and the reinforcement material 12 may also be provided on the resin. Alternatively, as shown in FIG. 9, only the reinforcement material 12 may be provided. Note that FIG. 8 shows an example of the IC card 1 in which the reinforcement material 12 is provided on the surface of the IC module 2 where the IC chip is not mounted, and further, the protect layer 15 is provided on the thermoplastic resin sheet 3b in the side opposite to the thermoplastic resin sheet 3a to which the reversible heat-sensitive recording sheet 14 is adhered.

Figure 10:
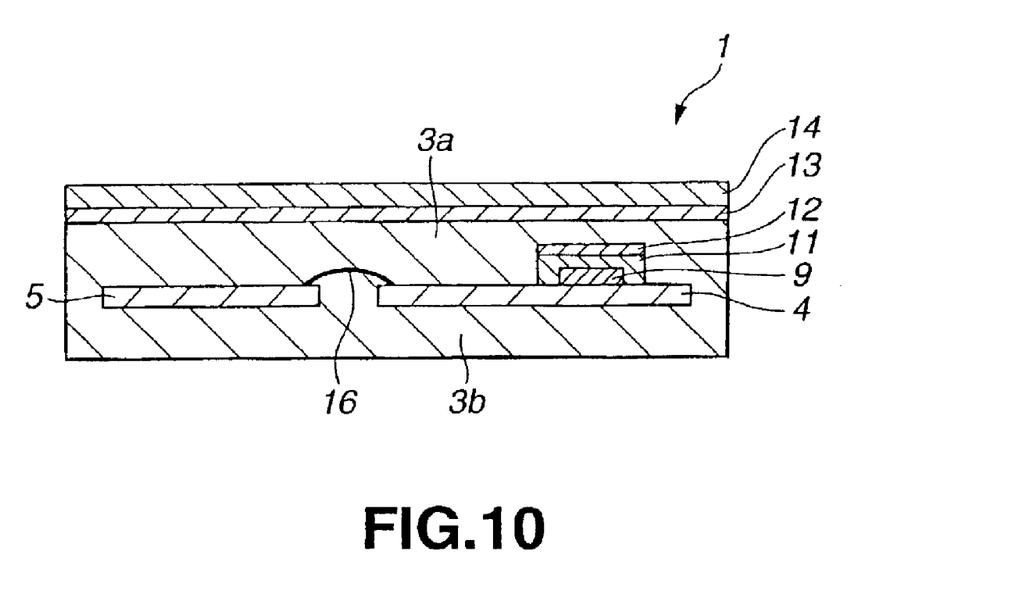
FIG. 10 is a cross-sectional view showing another structural example of an IC card according to the present invention.

In the IC card 1 shown in FIG. 10, the IC module 2 is constructed in a structure in which only the IC-chip mounting part of the insulating substrate 4 is made of a glass epoxy substrate, a plastic substrate, or the like, and the part of the antenna coil 5 is jointed optionally and electrically by a connection lead 16.

EXAMPLES

Next explanation will be made of experimental examples which have been carried out to check the advantages of the present invention. Although the following experimental examples will be explained with reference to specific numerical values, the present invention is not limited only to those values.

<Sample 1>

At first, an IC module was prepared.

At first, aluminum foil having a thickness of 20 nm is adhered to a polyethylene terepthalate film having a thickness of 50 μm. Next, an antenna pattern was formed by a resist agent, and an aluminum antenna pattern was formed by etching processing. Thus, an antenna module was prepared. An IC chip (4 mm×4 mm×180 μm) was mounted on the antenna module with a flip-chip adhesive organic conductive film having a thickness of 30 μm inserted therebetween. On the IC chip, an epoxy-based sealing material and further A5052 (having a diameter of 7 mm and thickness of 100 μm) as an IC chip reinforcement material were provided and hardened at 110° C. to prepare an IC module.

Then, formation of the reinforcement material after sealing was measured by a non-contact surface shape measurement device (manufactured by MITAKA-KOUKI).

A thermoplastic resin sheet was prepared as follows. Terephthalic acid, copolymer (PET-G) of cyclohexane dimethanol and ethylene glycol, titanium oxide as a white color filler were mixed at a weight ratio of 10%, and were sheeted to have a thickness of 350 μm by a melt-extrusion method, to obtain a thermoplastic resin sheet made of white PET-G.

Figures and letters were printed on one surface of this thermoplastic resin sheet by the screen printing method and the offset printing method. A set of the printed thermoplastic resin sheets for the front and back sides were prepared and arranged to sandwich the IC module prepared beforehand, with their printed surfaces oriented outsides. Four corners of the sheets are welded and fixed temporarily by an ultrasonic welding device.

A orientative polypropulene film sheet (OPP) having a thickness of 60 μm was provided outside the temporarily fixed sheet, and stainless mirror plates having a thickness of 3 mm were further arranged to sandwich them from outside. They were pressed into contact and thermally melted under conditions of a temperature of 170° C. and a pressure of 15 kg/cm² by heat-melting press, and were further cooled and solidified. The OPP was peeled to obtain a card-forming member which contains an IC module inlet.

A reversible heat-sensitive recording sheet was prepared as follows. At first, an Al layer was formed with a thickness of about 50 Å, as a coloring layer, on a polyethylene terephthalate film having a thickness of 50 μm by a vacuum vaporization method. A heat-sensitive recording layer coating material made of organic molecules dispersed in resin was coated thereon with a coating thickness of 10 μm at a dry temperature of 120° C. with use of a gravure method. Further, a protection layer was coated thereon with a coating thickness of 3 μm by a gravure printing method. Next, an adhesive coating material was coated with a thickness of 3 μm on the back surface of this sheet, at a dry temperature of 100° C., by the gravure method. A reversible heat-sensitive recording sheet was thus obtained.

Compositions of the heat-sensitive recording coating material, protection layer coating material, and adhesive coating material used were as follows.

[Heat-Sensitive Recording Coating Material]
  stearic acid: 8 weight part
  sebacic acid: 2 weight part
  acrylic acid copolymer: 5 weight part
  tetrahydrofuran: 20 weight part
  toluene: 20 weight part

[Protection Layer Coating Material]
  acryl-based resin: 50 weight part
  calcium carbonate filler: 2 weight part
  toluene: 100 weight part
  methyl ethyl ketone: 100 weight part

[Adhesive Coating Material]
  polyester-based resin: 40 weight part
  toluene: 50 weight part
  methyl ethyl ketone: 50 weight part Further, the card-forming member including the IC module, and the reversible heat-sensitive recording sheet were temporarily fixed again by the ultrasonic welding machine, with the heat-sensitive recording layer situated outsides. Orientative polypropylene film sheet was provided outside the temporarily fixed sheet, and further, stainless mirror plates having a thickness of 3 mm were used to sandwich them from outside. They were pressed and thermally melted under conditions of a temperature of 120° C. and a pressure of 15 kg/cm², and were cooled and solidified. Thereafter, punching was carried out into a card shape. In the manner as described above, a non-contact card having a reversible heat-sensitive recording layer was prepared.

<Samples 2 to 20>

Non-contact IC cards were prepared in the same manner as the sample 1 except that the materials shown in Table 1 were used as materials of the reinforcement material or the thermoplastic resin sheet.

<Samples 21 to 23>

Non-contact IC cards were prepared in the same manner as the sample 1 except that the materials shown in Table 1 were used as materials of the reinforcement material or the thermoplastic resin sheet and that a sealing material and a reinforcement material were further provided on the back surface side of the IC module which was opposite to the IC-mounting surface.

<Samples 24 to 28>

Non-contact IC cards were prepared in the same manner as the sample 1 except that the materials shown in Table 1 were used as materials of the reinforcement material or the thermoplastic resin sheet, that a sealing material and a reinforcement material were further provided on the back surface side of the IC module which is opposite to the IC-mounting surface, and a reversible heat-sensitive recording layer was provided on the side of the surface where no IC was mounted.

<Samples 29 to 34>

The thickness of the thermoplastic resin sheets made of white PET-G sheets was set to 330 μm. In addition, the IC module was sandwiched between the back PET-G sheet where figures were printed like the sample 1 and the front PET-G sheet without figures, and was temporarily fixed therebetween.

Card-forming members including IC modules were prepared in the same manner as the sample 1 except that a transparent PET-G sheet having a thickness of 50 μm and added with no white filler was provided on the figured surface of the temporarily fixed card-forming member. Non-contact IC cards each having a reversible heat-sensitive recording layer were thus prepared.

<Samples 35 to 38>

Non-contact IC cards were prepared in the same manner as the sample 1 except that the materials shown in Table 1 were used as materials of the reinforcement material or the thermoplastic resin sheet and that the reversible heat-sensitive recording layer was set in the surface where no IC was mounted.

With respect to the IC cards of the above samples 1 to 38, evaluations were made on the print characteristic, print layer adhesion, static load strength of IC reinforcing part, bending test, and possibility of generating a gas containing Cl.

At first, with respect to the print characteristic, a heat-sensitive printer manufactured by Matsushita Electric Industrial Co., Ltd. was used, and printing was carried out where application energy of the thermal head was 0.5 mJ/dot. The printed surface of the card was observed with eyes. When a print omission is caused at the part where the IC-mounting part was reinforced by the reinforcement material, the print characteristic was evaluated as ×. Otherwise, when there was no print omission, the print characteristic was evaluated as ○.

With respect to the print layer adhesion, printing and erasure were repeated 500 times. The condition of a figure on the print layer on the back surface of the heat-sensitive recording layer was observed with eyes. When a defect or peeling appears on the figure, the print layer adhesion was evaluated as ×. Otherwise, when there was no defect or peeling, the print layer adhesion was evaluated as ○.

With respect to the static load strength at the IC reinforcement part, load which involves IC breakdown on the IC chip mounting part was evaluated. The load position was at the center of the IC-chip mounting part, and the top end shape of the probe was set to be a sphere having a radius of 0.2 mm. The load test speed was set to 0.5 mm/min. As for the IC breakdown, a breakdown was decided at the time when communication became impossible.

The bending test was carried out according to the method described in JIS-X-6305. IC operation checks before and after the bending test were made with use of a reader/writer (communication device) manufactured by SONY (where 20 ICs were checked).

With respect to the possibility of generating a gas containing Cl, the possibility of Cl-containing-gas generation was evaluated to be present if there is a possibility of generating a gas containing Cl when a card is subjected to incineration deposition as abandonment processing. Otherwise, if there is no possibility of generating a Cl gas, the possibility of Cl-containing-gas generation was evaluated to be absent.

Evaluation results of the IC cards of the samples 1 to 45 together with their physical values will be shown in Tables 1 and 2.

TABLE 1

| | Reinforcement material | | | Difference of elevation after sealing (μm) | Visible recording layer | Printing characteristic | Reinforcement material | |
|---|---|---|---|---|---|---|---|---|
| | Type | Hardness (Hv) | Thickness (μm) | | | | IC mounting surface | IC non-mounting surface |
| Sample 1 | A5052 | 80 | 100 | 26 | IC mounting surface | × | Present | — |
| Sample 2 | A5052 | 80 | 50 | 30 | IC mounting surface | × | Present | — |
| Sample 3 | A5052 | 80 | 30 | 38 | IC mounting surface | × | Present | — |
| Sample 4 | C5210R | 230 | 100 | 15 | IC mounting surface | ○ | Present | — |
| Sample 5 | C5210R | 230 | 50 | 18 | IC mounting surface | ○ | Present | — |
| Sample 6 | C5210R | 230 | 30 | 23 | IC mounting surface | × | Present | — |
| Sample 7 | SUS304-H | 370 | 100 | 8 | IC mounting surface | ○ | Present | — |
| Sample 8 | SUS304-H | 370 | 50 | 10 | IC mounting surface | ○ | Present | — |
| Sample 9 | SUS304-H | 370 | 30 | 13 | IC mounting surface | ○ | Present | — |
| Sample 10 | SK-2 | 550 | 100 | 5 | IC mounting surface | ○ | Present | — |
| Sample 11 | SK-2 | 550 | 50 | 7 | IC mounting surface | ○ | Present | — |

TABLE 1-continued

| Sample | | | | | | | | |
|---|---|---|---|---|---|---|---|---|
| Sample 12 | SK-2 | 550 | 30 | 8 | IC mounting surface | ○ | Present | — |
| Sample 13 | SiO₂ | 600 | 100 | 3 | IC mounting surface | ○ | Present | — |
| Sample 14 | Al₂O₃ | 1100 | 100 | 1 | IC mounting surface | ○ | Present | — |
| Sample 15 | SUS304-H | 370 | 50 | 15 | IC mounting surface | ○ | Present | — |
| Sample 16 | SUS304-H | 370 | 50 | 16 | IC mounting surface | ○ | Present | — |
| Sample 17 | SUS304-H | 370 | 50 | 15 | IC mounting surface | ○ | Present | — |
| Sample 18 | None | — | — | — | IC mounting surface | x | — | — |
| Sample 19 | None | — | — | — | IC mounting surface | x | — | — |
| Sample 20 | SUS304-H | 370 | 50 | 9 | IC mounting surface | ○ | Present | — |

| | Card base material | IC reinforcement part static load strength (kgf) | Good products in bending test | Protect layer | Back printed layer | Possibility of generating a gas containing Cl |
|---|---|---|---|---|---|---|
| Sample 1 | PET-G | 5.8 | 16/20 | — | Partially peeled | No |
| Sample 2 | PET-G | 5.6 | 15/20 | — | Partially peeled | No |
| Sample 3 | PET-G | 5.5 | 14/20 | — | Partially peeled | No |
| Sample 4 | PET-G | 8.5 | 20/20 | — | Partially peeled | No |
| Sample 5 | PET-G | 7.7 | 20/20 | — | Partially peeled | No |
| Sample 6 | PET-G | 7 | 18/20 | — | Partially peeled | No |
| Sample 7 | PET-G | 11.2 | 20/20 | — | Partially peeled | No |
| Sample 8 | PET-G | 8.4 | 20/20 | — | Partially peeled | No |
| Sample 9 | PET-G | 7.6 | 20/20 | — | Partially peeled | No |
| Sample 10 | PET-G | 12.9 | 20/20 | — | Partially peeled | No |
| Sample 11 | PET-G | 11.2 | 20/20 | — | Partially peeled | No |
| Sample 12 | PET-G | 8.7 | 20/20 | — | Partially peeled | No |
| Sample 13 | PET-G | 14.3 | 13/20 | — | Partially peeled | No |
| Sample 14 | PET-G | 15.3 | 14/20 | — | Partially peeled | No |
| Sample 15 | PET-G 70%/PC: 30% | 8.6 | 20/20 | — | Partially peeled | No |
| Sample 16 | ABS | 8.2 | 20/20 | — | Partially peeled | No |
| Sample 17 | PET-G: 20%/PET: 60%/PET-G 20% | 8.3 | 20/20 | — | Partially peeled | No |
| Sample 18 | PET-G | 5.4 | 12/20 | — | Partially peeled | No |
| Sample 19 | PVC | 5.5 | 13/20 | — | Partially peeled | Present |
| Sample 20 | PVC | 8.3 | 20/20 | — | Partially peeled | Present |

TABLE 2

| | Reinforcement material | | | Difference of elevation after sealing ($\mu$m) | Visible recording layer | Printing characteristic | Reinforcement material | |
|---|---|---|---|---|---|---|---|---|
| | Type | Hardness (Hv) | Thickness ($\mu$m) | | | | IC mounting surface | IC non-mounting surface |
| Sample 21 | C5210R | 230 | 50 | 15 | IC mounting surface | ○ | Present | Present |
| Sample 22 | SUS304-H | 370 | 50 | 14 | IC mounting surface | ○ | Present | Present |
| Sample 23 | SK-2 | 550 | 50 | 10 | IC mounting surface | ○ | Present | Present |
| Sample 24 | C5210R | 230 | 30 | 34 | IC non-mounting surface | x | Present | Present |
| Sample 25 | C5210R | 230 | 50 | 15 | IC non-mounting surface | ○ | Present | Present |
| Sample 26 | SUS304-H | 370 | 30 | 8 | IC non-mounting surface | ○ | Present | Present |
| Sample 27 | SUS304-H | 370 | 50 | 15 | IC non-mounting surface | ○ | Present | Present |
| Sample 28 | SK-2 | 550 | 50 | 10 | IC non-mounting surface | ○ | Present | Present |
| Sample 29 | C5210R | 230 | 50 | 17 | IC mounting surface | ○ | Present | — |
| Sample 30 | SUS304-H | 370 | 50 | 14 | IC mounting surface | ○ | Present | — |
| Sample 31 | SK-2 | 550 | 50 | 9 | IC mounting surface | ○ | Present | — |
| Sample 32 | C5210R | 230 | 50 | 15 | IC mounting surface | ○ | Present | Present |
| Sample 33 | SUS304-H | 370 | 50 | 15 | IC mounting surface | ○ | Present | Present |
| Sample 34 | SK-2 | 550 | 50 | 10 | IC mounting surface | ○ | Present | Present |
| Sample 35 | C5210R | 230 | 30 | 23 | IC non-mounting surface | ○ | Present | — |
| Sample 36 | C5210R | 230 | 50 | 18 | IC non-mounting surface | ○ | Present | — |
| Sample 37 | SUS304-H | 370 | 30 | 13 | IC non-mounting surface | ○ | Present | — |
| Sample 38 | SUS304-H | 370 | 50 | 10 | IC non-mounting surface | ○ | Present | — |

| | Card base material | IC reinforcement part static load strength (kgf) | Good products in bending test | Protect layer | Back printed layer | Possibility of generating a gas containing Cl |
|---|---|---|---|---|---|---|
| Sample 21 | PET-G | 11.5 | 20/20 | — | Partially peeled | No |
| Sample 22 | PET-G | 12.5 | 20/20 | — | Partially peeled | No |
| Sample 23 | PET-G | 14.5 | 20/20 | — | Partially peeled | No |
| Sample 24 | PET-G | 7.2 | 20/20 | — | Partially peeled | No |
| Sample 25 | PET-G | 11.6 | 20/20 | — | Partially peeled | No |

TABLE 2-continued

| Sample | | | | | | |
|---|---|---|---|---|---|---|
| Sample 26 | PET-G | 11.5 | 20/20 | — | Partially peeled | No |
| Sample 27 | PET-G | 12.6 | 20/20 | — | Partially peeled | No |
| Sample 28 | PET-G | 14.7 | 20/20 | — | Partially peeled | No |
| Sample 29 | PET-G | 10.1 | 20/20 | PET-G | No change | No |
| Sample 30 | PET-G | 8.3 | 20/20 | PET-G | No change | No |
| Sample 31 | PET-G | 9.2 | 20/20 | PET-G | No change | No |
| Sample 32 | PET-G | 11.4 | 20/20 | PET-G | No change | No |
| Sample 33 | PET-G | 12.6 | 20/20 | PET-G | No change | No |
| Sample 34 | PET-G | 14.5 | 20/20 | PET-G | No change | No |
| Sample 35 | PET-G | 7 | 19/20 | — | Partially peeled | No |
| Sample 36 | PET-G | 7.6 | 20/20 | — | Partially peeled | No |
| Sample 37 | PET-G | 8.5 | 20/20 | — | Partially peeled | No |
| Sample 38 | PET-G | 7.7 | 20/20 | — | Partially peeled | No |

From the Table 1, at first, in the IC card of the sample 18 in which no reinforcement material was provided for the IC module, convexes and concaves of the IC chip part were reflected after card-formation, so that the flatness of the card was degraded. Therefore, the spacing between the heat-sensitive recording layer and the thermal head was enlarged, thereby causing print omissions. Further, in the sample 18, the IC operation rate after the bending test was 12/20, so that the IC chip or the junction between the IC chip and the antenna was broken, resulting in very bad reliability.

Figure 11:
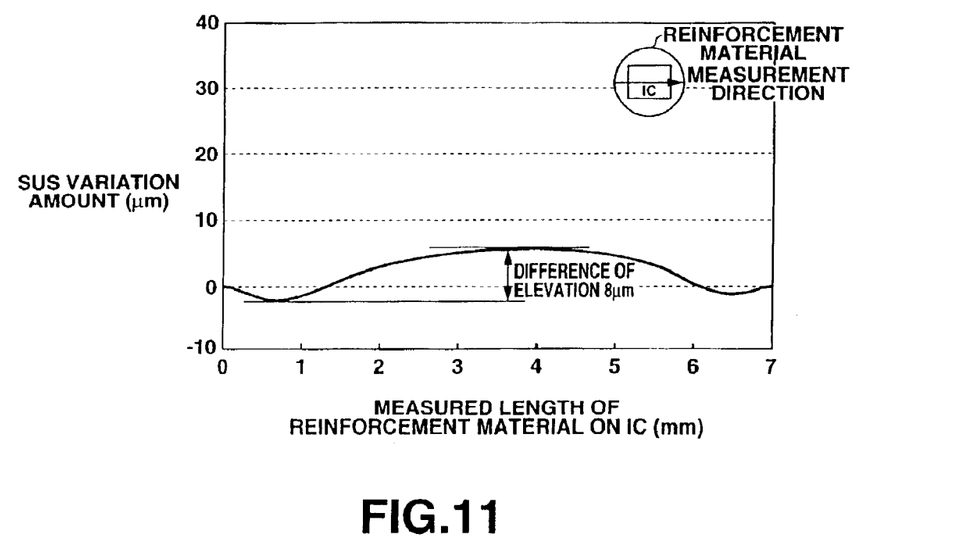
FIG. 11 is a graph showing a measurement result of the surface shape of a reinforcement material in an IC module prepared as a sample 7.

In contrast, in the samples in which the IC module was provided with a reinforcement material and the difference of elevation of the surface shape of this reinforcement material was set within 20 μm, the concaves and convexes of the IC chip part were not reflected after card-formation or deformation was not caused in accordance with contraction/hardening of the sealing material. Excellent flatness was obtained on the card surface. As a result of this, excellent print characteristic was obtained without causing spacing between the heat-sensitive recording layer and the thermal head. For example, FIG. 11 shows the surface shape measurement results of the reinforcement material with respect to the IC module of the sample 7.

Figure 12:
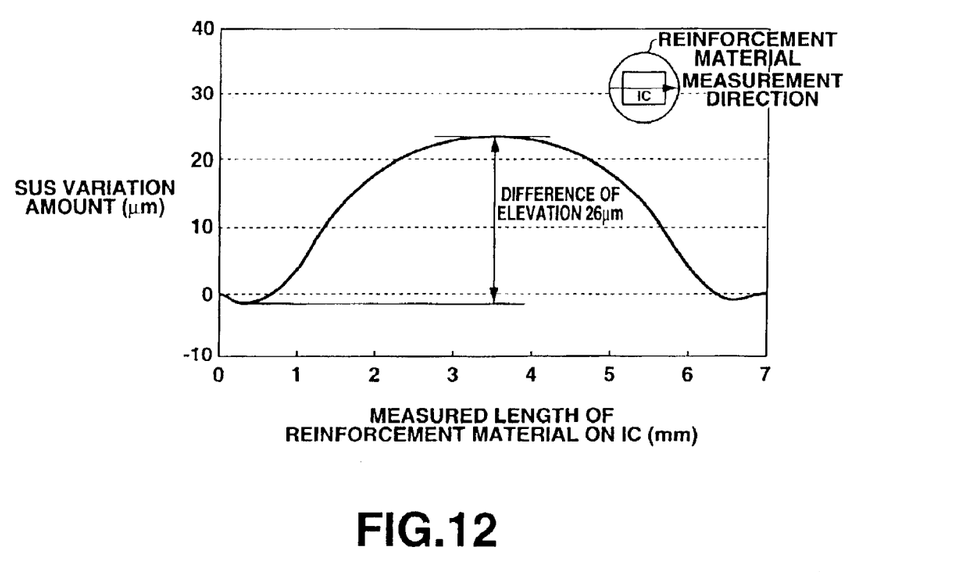
FIG. 12 is a graph showing a measurement result of the surface shape of a reinforcement material in an IC module prepared as a sample 1.

Specifically, in every of the samples 1 to 3 in which material having Vickers hardness smaller than 200 was used for the reinforcement material provided for the IC module, the difference of elevation of the surface shape was greater than 20 μm. The concaves and convexes thereof were reflected after card-formation, so that the flatness of the card surface was degraded. Therefore, the spacing was enlarged between the heat-sensitive recording layer and the thermal head, so print omissions were caused, thereby degrading the print characteristic. For example, FIG. 12 shows the surface shape measurement results of the reinforcement material with respect to the IC nodule of the sample 1.

Meanwhile, in the samples 13 and 14 using reinforcement material made of material having Vickers hardness of 580 or more, the difference of elevation of the surface shape was maintained to be small. On the other hand, softness of the reinforcement material was lost, so seven were defective among twenty samples 13 and six were defective among twenty samples 14.

Thus, by using material having Vickers hardness within a range of 200 or more and less than 580 as the material of the reinforcement material, the shape of the IC chip is prevented from being reflected on the surface of the reinforcement material and deformation is prevented from being caused in accordance with contraction/hardening of the sealing material, so that the surface shift among of the reinforcement material can be adjusted to 20 μm or less. On the other hand, the card is provided with optimal softness, so that the reliability in IC operation in the bending test can be improved excellently.

Figure 13:
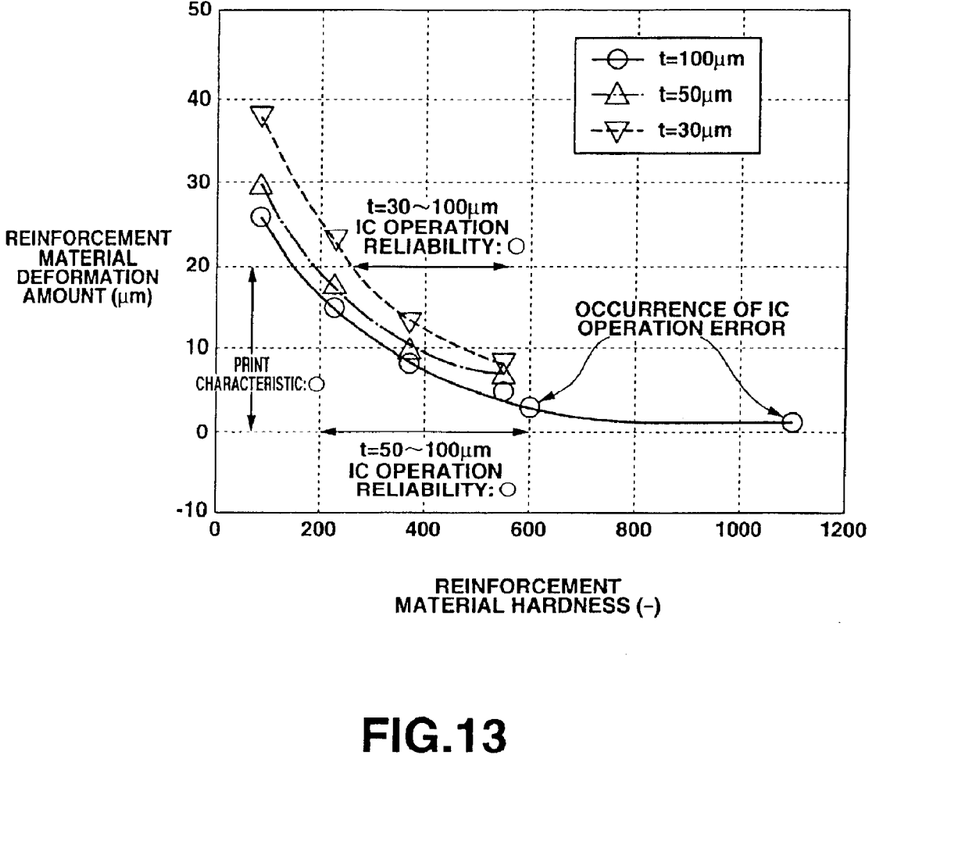
FIG. 13 is a graph showing the relationship between the hardness of the reinforcement material and the surface variation amount for every thickness of the reinforcement material.

Further, the relationship between the hardness and thickness of the reinforcement material will now be discussed. FIG. 13 shows the relationship between the Vickers hardness and thickness of the reinforcement material for every thickness of the reinforcement material.

From Table 1 and FIG. 13, at first, in the range that the Vickers hardness is less than 300 or the thickness is less than 30 μm, the reinforcement material had poor elasticity and causes deformation of the shape in accordance with hardening/contraction of the sealing material, so it is difficult to ensure reliability of the IC operation. Meanwhile, in the range that the Vickers hardness is 580 or more or the thickness exceeds 100 μm, the reinforcement material becomes fragile when the hardness exceeds. In the range in which the thickness exceeds, only the reinforcement material part becomes easily thick and becomes difficult to set it within the definitions according to JIS.

Accordingly, it has been found that the reliability of the mechanical strength of the IC chip part increases by providing the IC module with reinforcement material having Vickers hardness within a range of 300 or more and less than 580 and a thickness within a range of 30 μm or more and 100 μm or less, and by setting the difference of elevation of the surface shape within 20 μm. Thus, it is possible to prepare a non-contact card which has satisfactory print characteristic of the heat-sensitive recording layer.

Also from Table 1 and FIG. 13, in the range that the Vickers hardness is less than 200 or the thickness is less than 50 μm, the reinforcement material had poor elasticity and causes deformation of the shape in accordance with hardening/contraction of the sealing material, so it is difficult to ensure reliability of the IC operation. Meanwhile, in the range that the Vickers hardness is 580 or more or the thickness exceeds 100 μm, the reinforcement material becomes fragile when the hardness exceeds. In the range in which the thickness exceeds, only the reinforcement material part becomes easily thick and becomes difficult to set it within the definitions according to JIS.

Accordingly, it has been found that the reliability of the mechanical strength of the IC chip part increases by providing the IC module with reinforcement material having Vickers hardness within a range of 200 or more and less than 580 and a thickness within a range of 50 μm or more and 100 μm or less, and by setting the difference of elevation of the surface shape within 20 μm. Thus, it is possible to prepare a non-contact card which has satisfactory print characteristic of the heat-sensitive recording layer.

In the samples 19 and 20, polyvinyl chloride (PVC) was used for thermoplastic resin sheets, there is a possibility of generating a gas which may cause problems of hydrogen chloride, dioxin, and the like in incineration processing. In other samples which used material containing no chloride for the thermoplastic resin sheets, there is little possibility of generating a gas which may cause problems of hydrogen chloride, dioxin, and the like in incineration processing. Accordingly, it has been found that the problems of hydrogen chloride, dioxin, and the like can be avoided in incineration processing by using material containing no chloride for the thermoplastic resin sheets.

Also from Tables 1 and 2, it has been found that the static load strength can be further increased by providing the reinforcement material not only on the IC chip mounting surface but also on the surface where no IC chip was mounted, from comparison between the samples 5, 8, and 11, in which the reinforcement material was provided only on the IC chip mounting surface of the IC module, and the samples 21 to 23, in which the same reinforcement material was provided in the side of the IC module opposite to the IC-chip mounting surface.

In the samples 24 to 28 in Table 2, the reinforcement material was provided on both of the IC chip mounting surface and the surface where no IC was mounted, and further, the heat-sensitive recording layer is provided not in the side of the IC-mounting surface but on the surface where no IC was mounted. From these samples 24 to 28, it has been found that reliability of the mechanical strength of the IC part increased except the sample 24 in which the difference between the concaves and convexes exceeded 20 μm, and that a non-contact card which had satisfactory print characteristic could be obtained by further providing the heat-sensitive recording layer in the side of the surface where no IC was mounted.

In the samples 29 to 34, a protect layer was printed on the printed surface in the back side of the heat-sensitive recording layer. In other samples in which no protect layer was provided on the printed surface, peeling appeared on the heat-sensitive recording layer. In contrast, in the samples 29 to 34 in which a protect layer was provided, no peeling appeared on the heat-sensitive recording layer. Accordingly, it has been found that the adhesion of the printed layer can be protected by providing a protect layer on the printed surface in the back side of the heat-sensitive recording layer.

Further, it has been found that the static load strength can be increased and the printed surface can be protected by providing the reinforcement material also on the surface where no IC chip was mounted, from comparison between the samples 29 to 31, in which the reinforcement material was provided only on the IC chip mounting surface, and the samples 32 to 34, in which the reinforcement material was provided also on the surface where no reinforcement material was provided.

In the samples 35 to 38, a reversible heat-sensitive recording layer was provided on the surface where no IC chip was mounted. The cause and effect of the heat-sensitive reversible recording layer were all satisfied because there was no convex part since none of IC chip, resin sealing material, and reinforcement material was provided. However, unsatisfactory reliability appeared in the mechanical strength test of the IC chip of the sample 35 which used reinforcement material having Vickers hardness within a range of 200 or more and a thickness of 30 μm.

Accordingly, it has been found that it is possible to prepare a non-contact card which satisfies the print characteristic while ensuring the reliability of the mechanical strength of the IC chip part, by using reinforcement material having Vickers hardness within a range of 300 or more and less than 580 and a thickness within a range of 30 μm or more and 100 μm or less, or having Vickers hardness within a range of 200 or more and less than 580 and a thickness within a range of 50 μm or more and 100 μm or less, also in case of providing a reversible heat-sensitive recording layer on the side opposite to the IC chip mounting surface reinforced by reinforcement material.

INDUSTRIAL APPLICABILITY

In the IC card according to the present invention, concaves and convexes disappear from the card surface, by defining the surface variation amount (difference between convexes and concaves) of reinforcement material provided on the IC module, to be 20 μm or less.

As a result of this, the card has a good appearance and provides excellent print characteristic without blurs or print omissions even in printing on a visible recording layer.

What is claimed is:

1. A non-contact Integrated Circuit (IC) card comprising;
an IC module comprising:
a substrate;
an antenna carried on a surface of the substrate;
an IC chip connected to the antenna;
a sealing material sealing the IC chip to the surface of the substrate; and
a reinforcement material mounted on the sealing material, wherein the reinforcement material comprises a circular disk having a diameter greater than a longest dimension of the IC chip and a height variation less than or equal to 20 μm;
a first exterior film; and
a second exterior film, wherein the IC module is sandwiched between the first exterior film and the second exterior film.

2. The non-contact IC card according to claim 1, wherein the reinforcement material is a metal plate.

3. The non-contact IC card according to claim 1, wherein the reinforcement material has a Vickers hardness within a range of 200 or more and less than 580.

4. The non-contact IC card according to claim 3, wherein the reinforcement material has a Vickers hardness within a range of 200 or more and less than 580 and has thickness within a range of 50 μm or more and 100 μm or less.

5. The non-contact IC card according to claim 3, wherein the reinforcement material has a Vickers hardness within a range of 300 or more and less than 580 and has thickness within a range of 30 μm or more and 100 μm or less.

6. The non-contact IC card according to claim 1, further comprising a second reinforcement material on a second surface of the substrate opposite the surface on which the IC chip is sealed.

7. The non-contact IC card according to claim 1, wherein the exterior film comprises material containing no chloride.

8. The non-contact IC card according to claim 1, wherein the exterior film comprises non-crystal resin and crystal resin.

9. The non-contact IC card according to claim 1, wherein the exterior film comprises a double-side non-crystal sheet created by a co-extrusion method.

10. The non-contact IC card according to claim 1, further comprising a protect layer provided on the first exterior film or the second exterior film.

11. The non-contact IC card according to claim 1, wherein texts or figures are printed on the first exterior film or the second exterior film.

12. The non-contact IC card according to claim 11, further comprising a protect layer on the printed exterior film.

13. The non-contact IC card according to claim 1, wherein relief letters are embossed on the non-contact IC card.

14. The non-contact IC card according to claim 1, further comprising magnetic stripes formed on the non-contact IC card.

15. The non-contact IC card according to claim 1, further comprising a reversible heat-sensitive recording sheet on at least one of the exterior films, and an adhesive layer inserted therebetween, wherein the reversible heat-sensitive recording sheet comprises a high-molecule film, a reversible heat-sensitive recording layer which is formed on the high-molecule film and enables rewriting of visible information, and a transparent protect layer formed on the reversible heat-sensitive recording layer.

16. The non-contact IC card according to claim 15, wherein the heat-sensitive recording layer is a high-molecule/low-molecule type in which states change reversibly in accordance with the change of the crystal state of the organic low-molecule material dispersed in the mother material of the resin.

17. The non-contact IC card according to claim 15, wherein the heat-sensitive recording layer is a leuco compound type which utilizes reversible coloring reaction between an electron donor type coloring compound and an electron acceptor type compound which are dispersed in the mother material of the resin.

18. The non-contact IC card according to claim 15, wherein the reversible heat-sensitive recording sheet includes a coloring layer.

19. The non-contact IC card according to claim 18, wherein the coloring layer is prepared by forming a metal on the high-molecule film.

20. The non-contact IC card according to claim 15, wherein texts or figures are printed on the high-molecule films of the reversible heat-sensitive recording sheet or the reversible heat-sensitive recording layer or the protect layer.

21. The non-contact IC card according to claim 15, wherein relief letters are embossed on the non-contact IC card.

22. The non-contact IC card according to claim 15, wherein magnetic stripes are formed on the non-contact IC card.

23. The non-contact IC card according to claim 15, wherein the non-contact IC card absorbs ultraviolet light.

24. The non-contact IC card according to claim 1, wherein the substrate comprises polyethylene terephthalate or polyethylene naphthalate.

25. The non-contact IC card according to claim 1, wherein the IC module is sealed between the first resin layer and the second resin layer.

* * * * *